United States Patent [19]

Hasch et al.

[11] 4,354,161

[45] Oct. 12, 1982

[54] H.F. BROADBAND AMPLIFIER

[75] Inventors: Günter Hasch, Heilbronn; Willy Minner, Schwaigern, both of Fed. Rep. of Germany

[73] Assignee: Licentia Patent-Verwaltungs-G.m.b.H., Frankfurt am Main, Fed. Rep. of Germany

[21] Appl. No.: 127,864

[22] Filed: Mar. 6, 1980

[30] Foreign Application Priority Data

Mar. 6, 1979 [DE] Fed. Rep. of Germany ....... 2908741

[51] Int. Cl.³ ............................................. H03F 3/45
[52] U.S. Cl. ..................................... 330/254; 330/279
[58] Field of Search ........................... 330/254, 51, 279

[56] References Cited

U.S. PATENT DOCUMENTS 3,900,801  8/1975  Furuno ................................. 330/254
3,927,382 12/1975  Oki ...................................... 330/254

*Primary Examiner*—Michael J. Tokar
*Attorney, Agent, or Firm*—Spencer & Kaye

[57] ABSTRACT

An H.F. broadband amplifier comprises a transistorized differential amplifier input stage the potential of which is set by a voltage divider circuit, and an additional transistor for attenuating a.c. signals present at the input of the amplifier in its turned off stage, the emitter-collector parts of the additional transistor being connected into a collector current circuit of a transistor of the differential amplifier, and the base of the additional transistor being operated in base connection, and switched to a reference potential of low resistence in HF terms to reduce the capacitative coupling between input, and output of the amplifier circuit.

15 Claims, 6 Drawing Figures

४,३५४,१६१

H.F. BROADBAND AMPLIFIER

BACKGROUND OF THE INVENTION

This invention relates to an HF broadband amplifier switchable by means of an external control command between amplification and attenuation and including a differential amplifier input stage, and a voltage divider for setting the potential at the differential amplifier.

An RC element is usually arranged in a broadband amplifier, this RC element determining the lower limit frequency of the amplifier. If a surge occurs in the potential at the amplifier output when switching the amplifier on or off, then this surge in potential must be compensated for initially via the capacitor of the RC element and this leads to relatively long and very often undesirable switchover times. Previously it was to prevent these large changes in potential at the output connection of the amplifier. A four quadrant multiplier may be used for example to achieve this.

However, as will be seen later, such a circuit suffers from serious difficulties when it is desired to produce it as an integrated circuit due to the inherent capacitance of integrated circuit transistors which make it impossible to apply this circuit to integrated technology.

SUMMARY OF THE INVENTION

It is an object of the present invention, to provide a switchable broadband amplifier having a lower limit frequency of 100 kHz, for example, which may be switched over to extreme attenuation from amplification within a few microseconds. The ratio between amplification and attenuation should desirably be of the order of magnitude of 80 dB. The circuit should be monolithically integratable and should be able to manage with as few circuit elements as possible.

According to a first aspect of the invention, there is provided an HF broadband amplifier comprising a transistorised differential amplifier input stage, a voltage divide circuit for setting the potential at said differential amplifier input stage, an additional transistor for attenuating a.c. signals present at the input of said amplifier in its turned off condition, an emitter collector path for said additional transistor and connected into a collector current circuit of a transistor of said differential amplifier, and a base for said additional transistor operated in base connection, and switched to a reference potential of low resistance in HF terms to reduce capacitative coupling between input, and output of said amplifier circuit.

According to a second aspect of the invention, there is provided an HF broadband amplifier switchable by an external control command between amplification and attenuation, comprising a transistorised differential amplifier input stage, a voltage divider circuit for setting the potential at the differential amplifier and connected between the poles of the supply voltage and having a bypass discharge current circuit through which the d.c. current maintaining the d.c. voltage present at an operating resistor flows in the switched off condition of the differential amplifier wherein, for attenuating the a.c. signal present at the input of the amplifier in the turned off condition, the emitter-collector path of an additional transistor is inserted into at least one collector current circuit of the transistor of said differential amplifier between the collector and said operating resistor which lies in the current circuit; and the base of the transistor is operated in base connection, and switched to a reference potential of low resistance in HF terms to reduce the capacitative coupling between the input, and output of the amplifier circuit.

BRIEF DESCRIPTION OF THE DRAWINGS

The invention will now be described in greater detail, by way of example, with reference to the drawings, in which.

DESCRIPTION OF THE PREFERRED EMBODIMENTS

Figure 1:
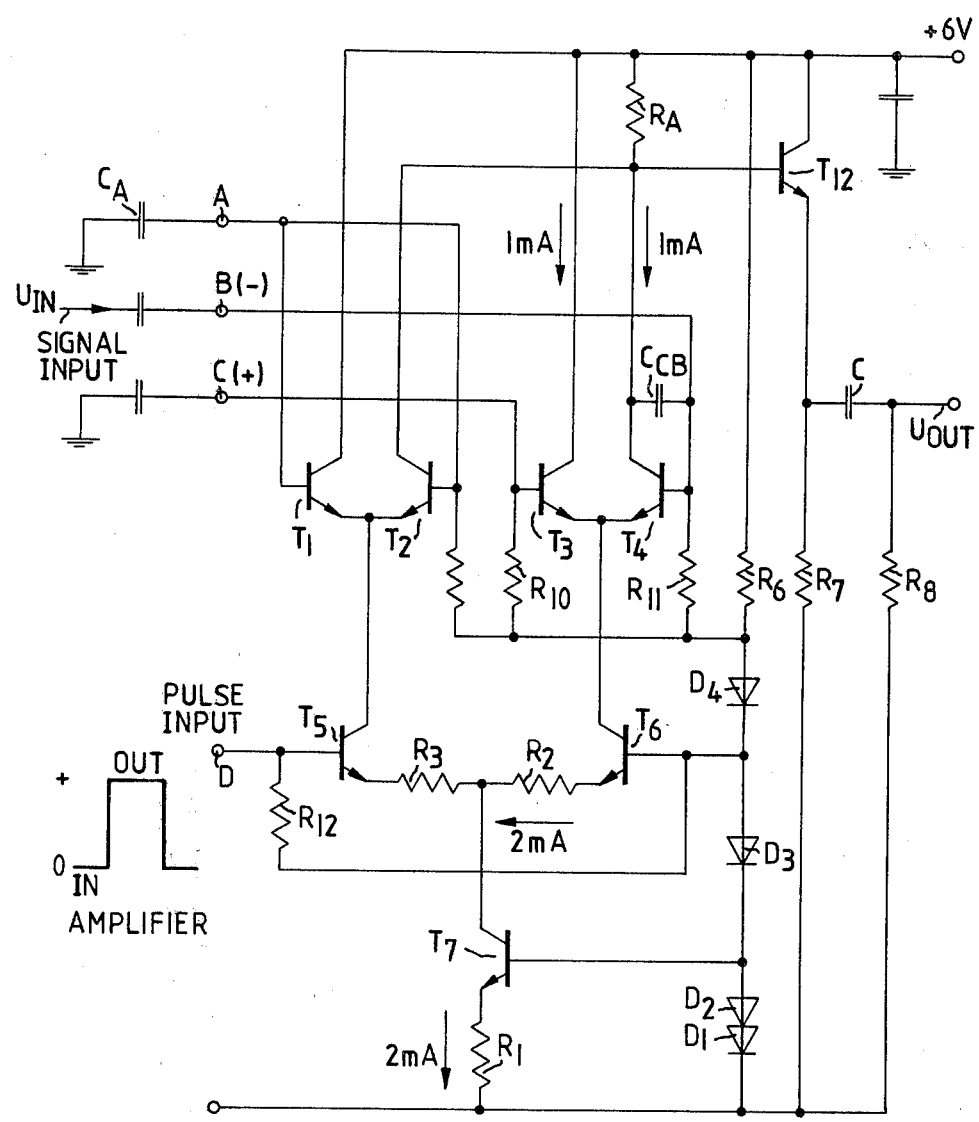
FIG. 1 is a circuit diagram of an HF amplifier constructed in accordance with known principles.

In order to appreciate the operation of the amplifier according to embodiments of the invention, a known HF amplifier circuit will be described with reference to FIG. 1.

It has previously found to be desirable if large potential charges at the output of the amplifier could be prevented. In FIG. 1 a four quadant multiplier was proposed for this purpose. The amplifier shown in FIG. 1 comprises two differential amplifiers in which the actual signal amplification is caused by the differential amplifier having the transistors $T_3$ and $T_4$. The second differential amplifier comprising the transistors $T_1$ and $T_2$ serves to take over the current when the differential amplifier comprising the transistors $T_3$ and $T_4$ is switched off. With two differential amplifiers the emitter electrodes of the transistors taking part are linked together and in each case switched into the collector path of a transistor $T_5$ or $T_6$ respectively, the emitter electrodes thereof are connected via resistors $R_2$ and $R_3$ to a current source. The current source comprises a transistor $T_7$ having a current setting resistor $R_1$ in the emitter branch of the transistor. The potential at the base electrode of the transistor $T_7$ is set with the aid of the diodes $D_1$ and $D_2$, a voltage of approximately 1.4 V dropping across these diodes.

The base electrode of the transistor $T_5$ forms the pulse input for switching the amplifier on or off. This input connection is linked to the base electrode of the transistor $T_6$ via a resistor $R_{12}$. The base potential of the transistor $T_6$, approximately 2.1 volts, is set with the aid of the diode $D_3$ which is connected in series with the diodes $D_1$ and $D_2$. A further diode $D_4$ connected in series with the diodes already mentioned determines the base potentials of the transistors $T_1$ and $T_2$ as well as $T_3$ and $T_4$ by means of the resistors $R_{11}$ and $R_{10}$, whereby a potential of approximately 2.8 V prevails at the diode $D_4$. The resistor $R_A$ which is connected to the d.c. voltage source lies in the collector circuit of the transistor $T_4$ of the differential amplifier. The output signal is taken off at the connection between the resistor $R_A$ and the collector of the transistor $T_4$ and is supplied via an output amplifier $T_{12}$ and an RC element C and $R_8$ to the output connection $U_{out}$. This connection point between the resistor $R_A$ and the collector of the transistor $T_4$ is simultaneously connected to the collector of the transistor $T_2$ of the second differential amplifier.

The broadband amplifier is then switched on if zero potential, for example, appears at the input terminal D which leads to the base electrode of the transistor $T_5$. A current which is set with the aid of the resistor $R_1$ then flows through the transistor $T_6$. This current amounts to 2 mA, for example. Half of the d.c. current in each case flows from the d.c. voltage source through the transistor $T_3$ or through the operating resistor $R_A$ and the transistor $T_4$ respectively of the associated differential amplifier. In a circuit which has been implemented, the amplification $V_s$ amounts to 22 corresponding to 26.8 dB with a resistor $R_A=1.5$ k $\Omega$ and a d.c. supply voltage of 6 V.

If a positive signal is supplied to the pulse input D, the transistor $T_6$ is blocked and thus the differential amplifier comprising transistors $T_3$ and $T_4$ is switched off. The current which is 2 mA for example and which flowed previously through the differential amplifier comprising the transistors $T_3$ and $T_4$ now flows through the differential amplifier comprising transistors $T_1$ and $T_2$ in two equal parts. Thus, since a current of 1 mA flows through the transistor $T_2$ alone, this current being drawn via the resistor $R_A$, the d.c. potential at the connection point between the resistor $R_A$ and the transistor $T_4$ must remain constant so that no large change in the potential affecting the switching times takes place at the output of the amplifier.

The base electrodes of the transistors $T_1$ and $T_2$ are blocked off in terms of high frequency at the common connection A by a capacitor $C_A$, so that the current is not modulated through the transistor $T_2$ so that, as a result, there is no high-frequency voltage produced across the operating resistor $R_A$. Thus it is assumed that a HF signal is present moreover at the signal input B. A part of this HF a.c. input voltage will reach the resistor $R_A$ however via the unavoidable collector-base capacitance $C_{CB4}$ of the transistor $T_4$. In FIG. 1, this capacitance $C_{CB}$ *which is specific to a component is inserted into the circuit diagram. In the case of certain broadband amplifiers it is required that a difference of* 80 dB for example should exist between the a.c. output voltage in the switched on condition of the amplifier and the residual a.c. voltage still present when the amplifier is switched off. The attenuation must therefore amount to 53.2 dB in the example shown, corresponding to 460 times the value, if an amplification of 26.8 dB is assumed when the amplifier is switched on. This would mean that the capacitance $C_{CB}$ should not be greater than $25 \cdot 10^{-3}$ in the circuit in accordance with FIG. 1. The capacitance of an integrated transistor is usually approximately 100 times greater than the said value however so that the sought after attenuation cannot be implemented with a circuit in accordance with FIG. 1.

Figure 2:
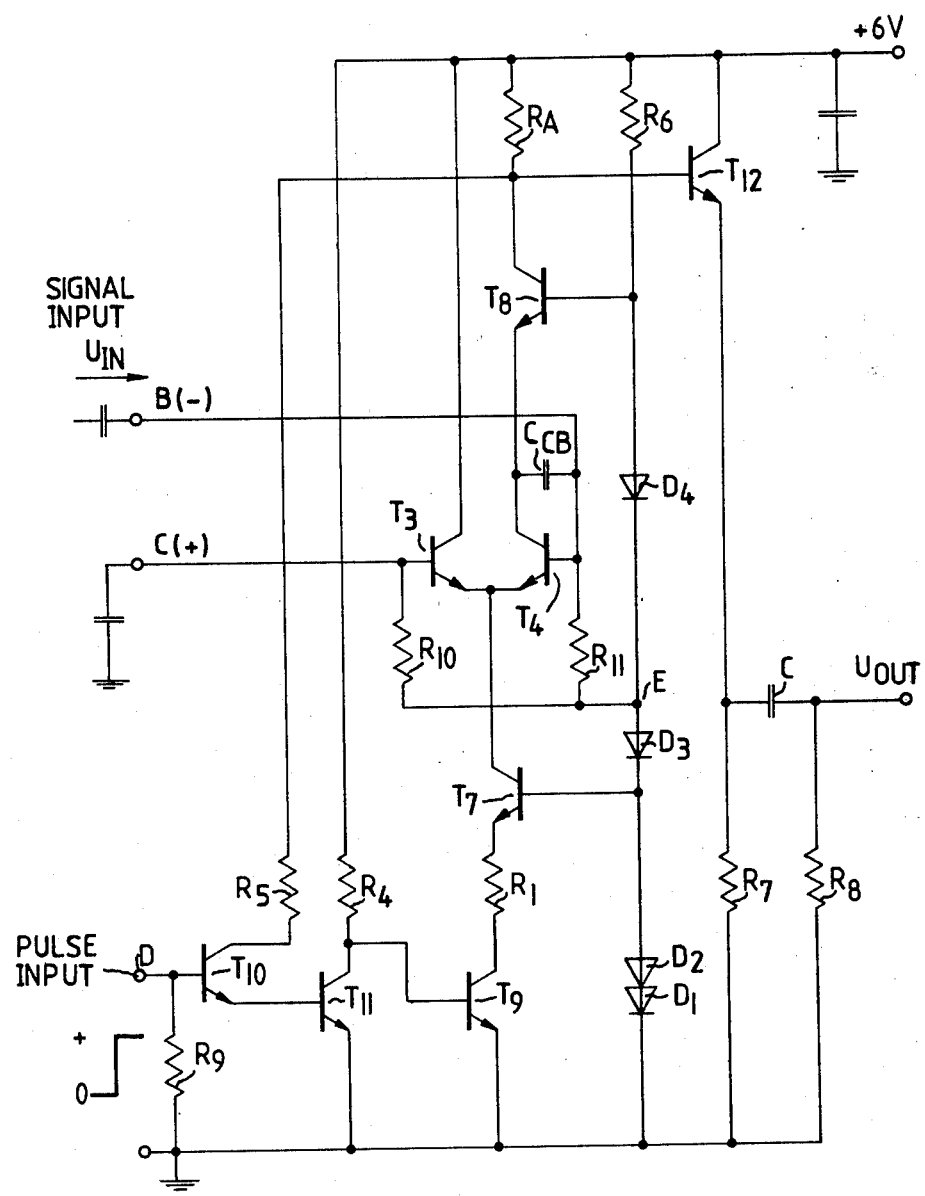
FIG. 2 is a circuit diagram of a first form of HF amplifier in accordance with the invention.

Thus the present invention has sought to overcome the problems inherent in the circuit shown in FIG. 1. As shown in FIG. 2, in order to attenuate the a.c. signal present at the input of the amplifier in its turned off condition, an additional transistor $T_8$ is inserted into at least one collector current circuit between the collector and the operating resistor $R_A$ such that the base of the additional transistor $T_8$, which is operated in base connection, is switched to a reference potential which is of low resistance in HF terms whereby the capacitative coupling between the input and the output of the amplifier circuit is reduced.

In order to connect the base of the additional transistor $T_8$ to the reference potential so as to be low in resistance in terms of high frequency, a low resistance differential resistor, which for example comprises diodes operated in a forward direction, is switched between the base electrode and reference potential. Thus it is a question preferably of the diodes in the voltage divider circuit which are used to adjust the potential at the differential amplifier.

Thus it is possible to manage with the same number of diodes in the voltage divider circuit as in the circuit according to FIG. 1 if, in one embodiment of the invention, the current source of the differential amplifier is arranged in the current circuit between the emitter electrodes of the differential amplifier transistors and the reference potential and if circuit means are provided by means of which the current source and the bypass current a discharge circuit may be switched simultaneously so that in each case current may only flow in one of these current circuits.

Thus it is possible to connect the current source to the reference potential via a switching transistor and to trigger this switching transistor by means of an externally supplied control command. The control command is passed to a switching transistor in the bypass current or discharge circuit via which circuit the switching transistor connected after the current source is triggered in a manner which is still to be explained.

On the other hand there is the possibility of switching off the current source by short-circuiting the operating voltage of the current source which is derived from the voltage divider circuit with the aid of a switching transistor triggered by means of the control command. The bypass or discharge current circuit is driven via a further switching transistor triggered simultaneously, so that the d.c. voltage applied to the operating conditions of the differential amplifier. Switchover of the differential amplifier between amplification and attenuation or vice versa may take place in a period of time which is substantially shorter than the reciprocal value of the lower frequency limit.

With the aid of the circuit in accordance with the invention a relationship between amplification and attenuation could be achieved which amounts to a minimum of 80 dB. This result has been achieved in a circuit which was operated with a stabilized d.c. voltage of only 6 V.

The circuit in accordance with FIG. 2 comprises a differential amplifier having transistors $T_3$ and $T_4$, the emitter electrodes of which are connected together and are in connection with a current source. The base electrodes of transistors $T_3$ and $T_4$ form the inverting and non-inverting input terminals of the amplifier.

The current source comprises the transistor $T_7$, the collector electrode of which is connected to the emitter eletrodes of the transistors $T_3$ and $T_4$ and this transistor $T_7$ has a resistor $R_1$ and the collector-emitter path of a switching transistor $T_9$ in its emitter branch. The base d.c. voltage for the transistor $T_7$ is tapped at the series connection comprising rectifying components $D_1$ to $D_4$, which series connection is in turn connected in series with the resistor $R_6$ between the poles of the d.c. voltage source. In the circuit in accordance with FIG. 2, the diodes $D_1$ and $D_2$ are connected parallel with the base emitter path of the transistor $T_7$ and with the emitter current circuit of this transistor. Thus, for example, a voltage of 1.4 V is applied to the base electrode of $T_7$. The magnitude of the resistance $R_1$ in the emitter path of the transistor $T_7$ determines the total current flowing through the differential amplifier which is intended to amount in turn to approximately 2 mA in a suitable embodiment.

The base d.c. voltage for the transistors $T_3$ and $T_4$ is tapped off at the diode $D_3$ via the series resistors $R_{10}$ and $R_{11}$, which diode $D_3$ is connected in series with the diodes $D_1$ and $D_2$. A voltage of 2.1 V, for example, is applied to the potential tapping E.

A fourth diode $D_4$ is connected in series with the the other diodes, the base d.c. voltage for the transistor $T_8$, the collector emitter path of which is connected into the collector circuit of the transistor $T_4$, being tapped at the fourth diode $D_4$. Thus a d.c. voltage of approximately 2.8 V is also applied to the base of the transistor $T_8$. The collector electrode of this additional transistor $T_8$ operating in base connection is connected to the operating resistor $R_A$, the other connection electrode thereof being connected to the d.c. voltage source of $+6$ V, for example.

The amplifier signal is tapped off at the connection point between the operating resistor $R_A$ and the collector of the transistor $T_8$ and is passed away via an output amplifier comprising a transistor $T_{12}$ and via an RC element connected thereafter comprising the capacitance C and resistor $R_8$ to the connection $U_{out}$. The transistor $T_{12}$ is triggered at the base and has the resistor $R_7$ in its emitter circuit. The series connection comprising the capacitance C and the resistor $R_8$ is connected in parallel with this resistor $R_7$; the output terminal $U_{out}$ is connected at the point of connection between the capacitance C and the resistor $R_8$.

The circuit port comprising transistors $T_{10}$, $T_{11}$ and $T_9$ serves to switch the differential amplifier on or off. The base electrode of the transistor $T_{10}$ forms the pulse input D, while the collector electrode of this transistor is connected to the point of connection between the operating resistor $R_A$ and transistor $T_8$ in order to form the bypass or discharge current circuit via a resistor $R_5$. The emitter electrode of the transistor $T_{10}$ leads to the base of the transistor $T_{11}$, connected thereafter, the latter drawing its collector current from the d.c. voltage source via the resistor $R_4$. In turn, the base of the switching transistor $T_9$ is connected to the collector of this transistor $T_{11}$, its collector emitter path lying in the emitter current branch of the transistor $T_7$.

In the circuit according to FIG. 2, the lower frequencies limit of the broadband amplifier is set with the aid of the RC element comprising the resistor $R_8$ and the capacitor C. It amounts for example to $f_u = 100$ kHz. The upper limit frequency is $f_o = 10$ MHz for example.

The circuit in accordance with FIG. 2 operates as follows in its part which is essential to the invention:

If earth potential is applied to the pulse input D, the transistor $T_{10}$ is blocked as is the transistor $T_{11}$ connected thereafter. The transistor $T_9$ is switched into saturation by the relatively high potential at the collector electrode of transistor $T_{11}$ so that the current set with the aid of resistor $R_1$ is able to flow through the differential amplifier comprising transistors $T_3$ and $T_4$. This current amounts, for example, to 2 mA and is divided into two parts between the collector paths of transistors $T_3$ and $T_4$, each having 1 mA. The collector current of transistor $T_4$ flows through the operating resistor $R_A$ and the collector emitter path of the additional transistor $T_8$ which is operated in base connection. This transistor $T_8$ has a current amplification of approximately $\alpha \sim 1$. In the embodiment shown, the operating resistor $R_A$ has a value of approximately $R_A = 1.5$ k $\Omega$. The voltage amplification of the differential amplifier is not changed with respect to the circuit according to FIG. 1 by the additionally inserted transistor $T_8$. It amounts to 26.8 dB for example with the said current and resistance ratios.

As compared to the circuit according to FIG. 1, in the circuit in accordance with the invention, the transistors $T_5$ and $T_6$ as well as the differential amplifier comprising $T_1$ and $T_2$ are omitted. By omitting the current distributor switches comprising transistors $T_5$ and $T_6$ which are now replaced by the switching transistor $T_9$ operated in the saturation range, the base electrodes of the transistors $T_3$ and $T_4$ of the differential amplifier may be operated at bias voltage which is less than in the circuit according to FIG. 1 by $U_{BE}$.

By inserting the additional transistor $T_8$ which requires a base-biased voltage 1 $U_{BE}$ higher than the differential amplifier comprising transistors $T_3$ and $T_4$, the voltage at the base connection of transistor $T_8$ amounts to 4 $U_{BE}^2$ which corresponds approximately to the value of 2.8 V. The collector of transistor $T_8$ which is connected to the resistor $R_A$ may be triggered by the same a.c. voltage amplitude as was the case in the circuit according to FIG. 1. Thus the same measure of modulation may be achieved without changing the magnitude of the d.c. supply voltage.

In order to switch off the differential amplifier, a positive input voltage is applied to the pulse input D. Thus the transistor $T_{10}$ is through controlled and so is the transistor $T_{11}$. The collector electrode of transistor $T_{11}$ is drawn to earth potential and transistor $T_9$ is blocked thereby. The transistors $T_3$ and $T_4$ may no longer take over any current. The current flowing through the operating resistor $R_A$ when the differential amplifier is switched off, this current being 1 mA for example, is now directed away via the resistor $R_5$. The resistor $R_5$ must be selected so that the current flowing through it corresponds, when the transistors $T_{10}$ and $T_{11}$ are driven, to the value which flowed initially through the operating resistor when the differential amplifier was switched on. The resistor $R_5$ may be replaced therefore, for example, by a constant current source or some other suitable current setting element. Since the current is not, therefore, changed by the operating resistor $R_A$ independently of the switching condition of the amplifier, there is no surge in potential occurring at the output of the amplifier so that extremely short switching on and switching off times are possible.

Figure 3:
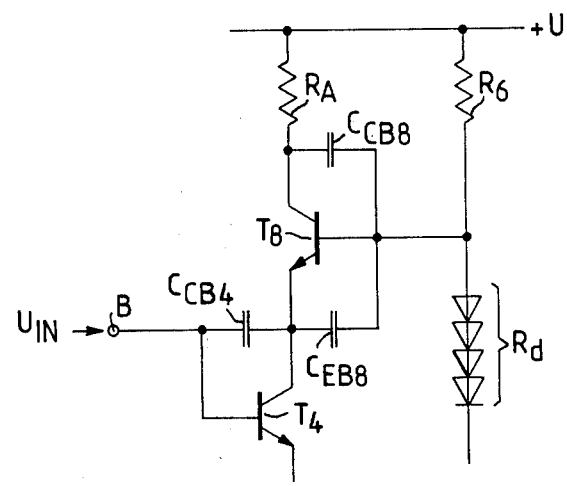
FIG. 3 is a partial circuit diagram showing a modified part of the circuit of FIG. 2.

The input signal which is also present at input B does however have an effect on its collector via the collector base capacitance $C_{CB}$ of the transistor $T_4$. The connection of the additional transistor $T_8$ causes a substantial attenuation of this capacitative coupling, however, as is apparent from the portion of the circuit in accordance with FIG. 3. In accordance with FIG. 3, the input signal $U_{in}$ arrives via the collector-base capacitance $C_{CB4}$ of the transistor $T_4$ at the emitter connection of the transistor $T_8$. The additional attenuation is achieved by voltage division across the emitter-base-blocking layer capacitance $C_{EB8}$ of the blocked transistor $T_8$ in respect of the differential resistor $R_d$ and the following division is achieved in respect of the operating resistor $R_A$ by the collector-base-blocking layer capacitance $C_{CB8}$ of transistor $T_8$. The differential resistance $R_d$ formed by the stabilization diodes $D_1$–$D_4$ (FIG. 2) amounts to 100 $\Omega$.

In a circuit which has been implemented, the ratio between amplification and attenuation at 7 MHz was 84 dB with a maintained value of the operating resistor $R_A=1.5$ k $\Omega$, whereby the requirements made were substantially surpassed.

In the case of the circuit in accordance with the invention according to FIG. 2, besides the differential amplifier comprising transistors $T_1$ and $T_2$, the capacitor $C_A$ required in the circuit according to FIG. 1 is also dispensed with.

The high-frequency characteristics of the circuit according to FIG. 2 may be improved still further with regard to increased amplification in the upper frequency range if the operating resistor $R_A$ is constructed as a voltage divider and if the resistor $R_5$ of the bypass discharge current circuit is connected to the tapping of this voltage divider. A circuit modified in this way is provided for example from FIG. 4 in which the resistance $R_A$ is subdivided into two equal parts. As a result the unavoidable capacitative effect of the resistor $R_5$ or a corresponding current setting element is reduced. With a subdivision of the operating resistance $R_A$ into halves, the resistor $R_5$ or the corresponding current setting element must of course be selected such that a current which is twice as large flows through it when the differential amplifier is switched off as is bypassed or discharged by the parts of the operating resistor when the differential amplifier is switched on. In the circuit according to FIG. 4 and with a current of 1 mA, for example, through the transistor $T_4$ when the differential amplifier is switched on, this means that the resistor $R_5$ must be selected so that a current of 2 mA flows through it when the differential amplifier is switched off. In the case of these current relationships, it is ensured that the same d.c. voltage potential is always applied to the base electrode of the transistor $T_{12}$, independently of the switching condition of the differential amplifier.

The resistor $R_A$ may be subdivided into any other ratio desired if the resistor $R_5$ is provided with a value which guarantees that the d.c. voltage potential at the base electrode of transistor $T_{12}$ is maintained.

Figure 4:
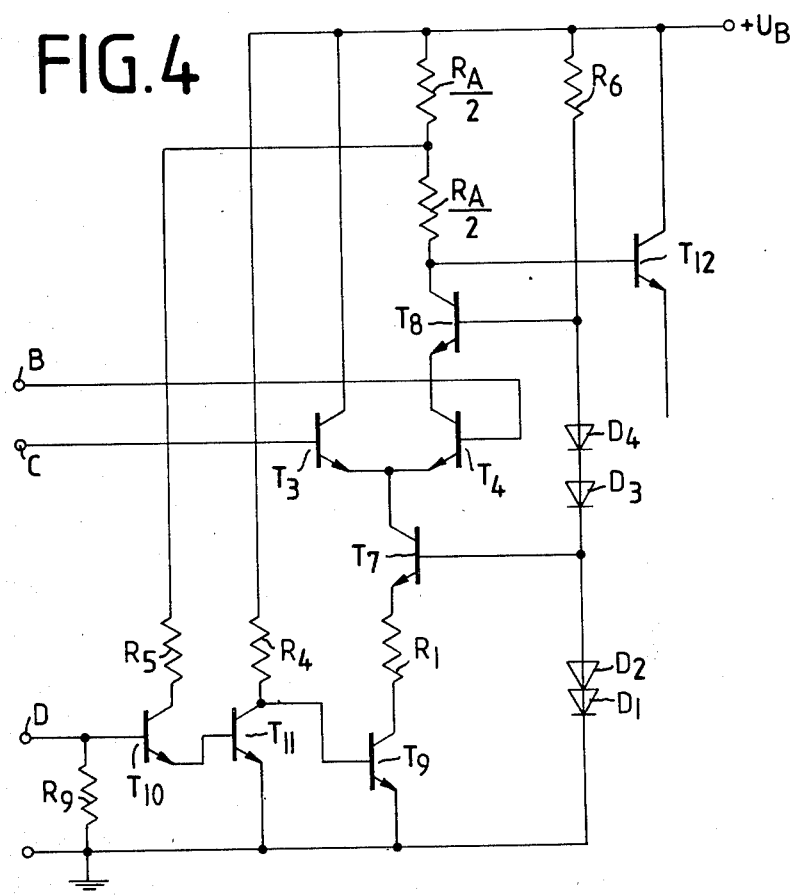
FIG. 4 is a circuit diagram of a further form of HF amplifier in accordance with the invention.
Figure 5:
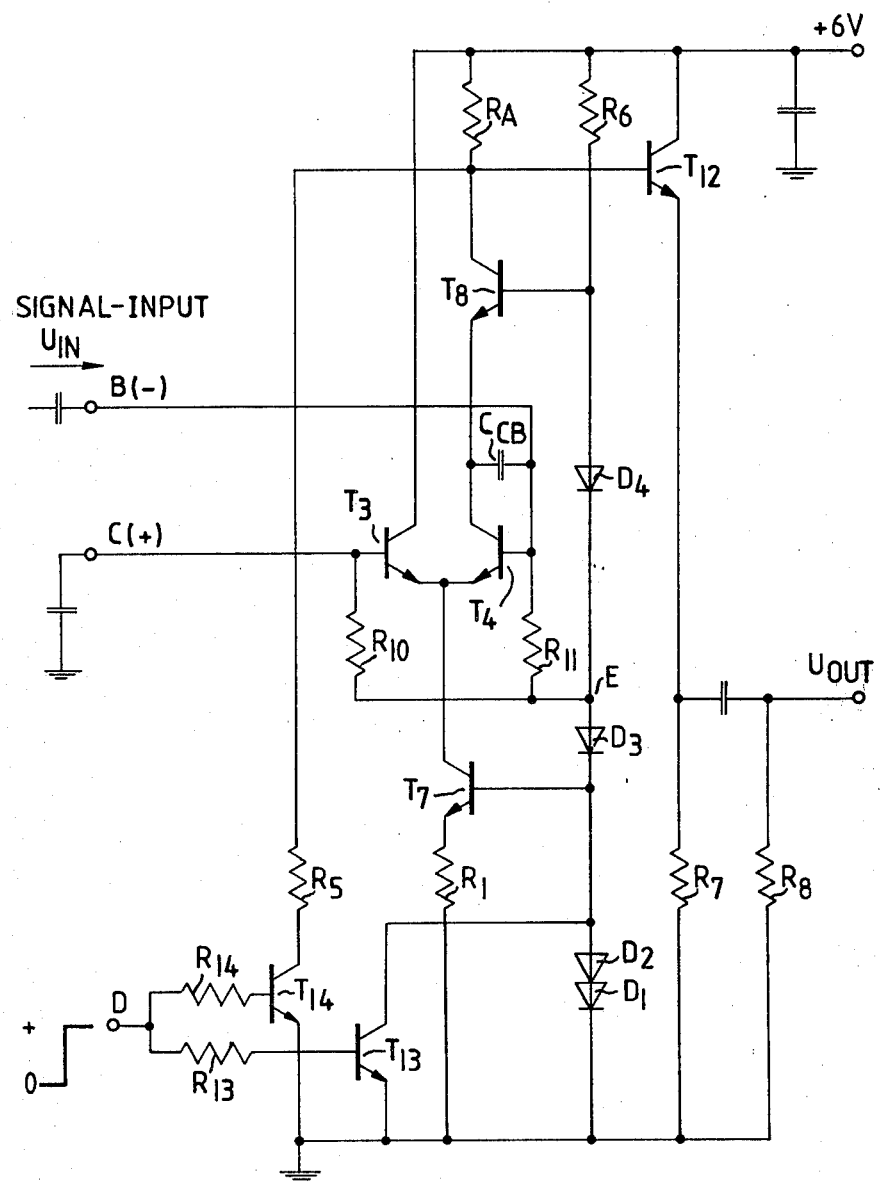
FIG. 5 is a circuit diagram of yet a further form of H.F. amplifier in accordance with the invention.

In FIG. 5 an embodiment is shown as further refinement of the circuit in accordance with the invention which differs with respect to the bypass or discharge current circuit and the circuit part of the circuit according to FIGS. 2 and 4 causing switchover of the current source of the differential amplifier.

The input resistor $R_1$ of the current source is connected directly between the emitter electrode of the transistor $T_7$ belonging to the current source and reference potential. In parallel with the diodes $D_1$ and $D_2$ in the voltage divider circuit, across which diodes the operating voltage of the current source drops, the collector emitter path of a switching transistor $T_{13}$ is connected, this transistor $T_{13}$ being connected at its base via a series resistance $R_{13}$ to the control command. At the same time, the base electrode of a further switching transistor $T_{14}$ is connected via a resistor 14 to the input D for the control command, the collector emitter path of the switching transistor $T_{14}$ lying in the bypass or discharge current circuit.

If reference potential is applied to the input D, both switching transistors $T_{13}$ and $T_{14}$ are blocked so that on the one hand, no current is able to flow through the bypass or discharge current circuit and on the other hand the current source and thus the differential amplifier is switched on.

If a positive control command is applied to the input D, then both transistors $T_{13}$ and $T_{14}$ are controlled into saturation. Thus the base potential of the transistor $T_7$ is drawn to reference potential in the current source so that this transistor is blocked and thus the current source is switched off. At the same time, however, the bypass or discharge current circuit is switched on via the transistor $T_{14}$ so that the d.c. current initially flowing through the operating resistor $R_A$ is derived via the resistor $R_5$ and the transistor $T_{14}$ by maintaining the d.c. voltage applied to the operating resistor.

Figure 6:
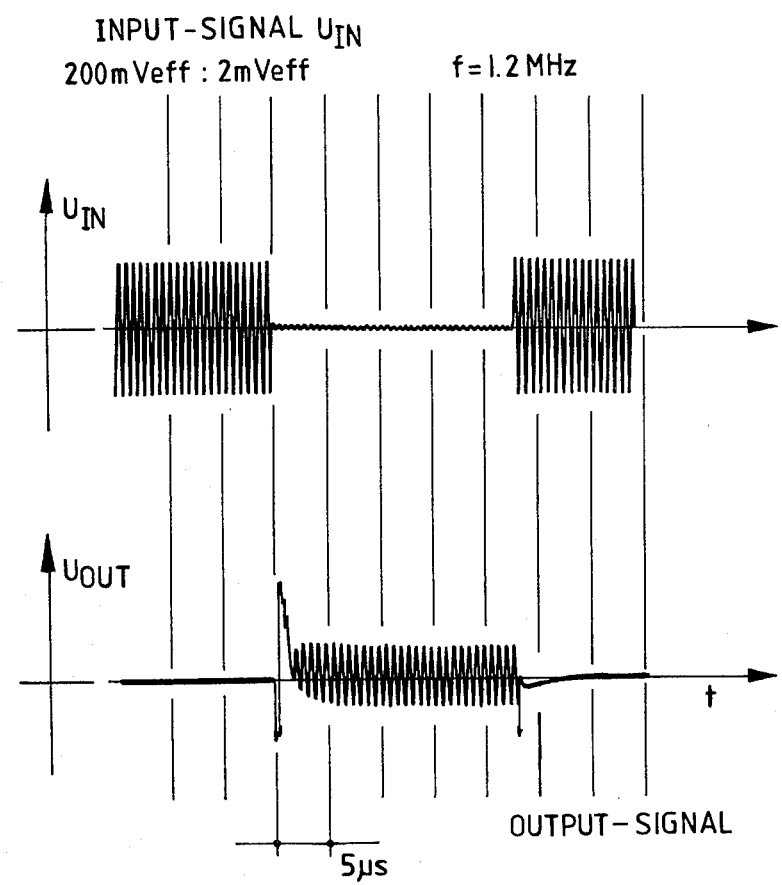
FIG. 6 is an occillogram showing input and output signals of the embodiment according to FIG. 2.

FIG. 6 shows an oscillogram of the input and output voltages. In a first phase, for example, an a.c. voltage having an effective value of 200 mV is applied to the input connection B of the circuit in accordance with FIG. 2. Positive potential is applied to the pulse input D so that the differential amplifier is switched off. In a second phase an a.c. signal is applied to the input B at a voltage of 2 $mV_{eff}$. Earth potential is applied to the pulse input D so that the differential amplifier is switched on. The input signal will appear amplified at the output $U_{out}$. The amplification factor amounts for example to 26.8 dB. In a third phase a voltage of 200 $mV_{eff}$ is in turn applied to the input B while the differential amplifier is again switched off via the input D. At the output $U_{out}$, an output signal occurs as in the first phase, the output signal being attenuated with respect to that of the second phase by at least 80 dB. The extreme change in the input signal in the case of a differential amplifier which is switch on or switched off is brought about compulsorily for example by means of external circuits. As can be gathered from FIG. 6, the switching on or switching off times at the output are very short and are 2 $\mu$sec, for example, while the reciprocal value of the lower limit frequency of the amplifier selected of 100 kHz amounts to 10 $\mu$sec. The ratio between the amplification and attenuation amounts to 84 dB in a circuit which has been implemented in accordance with FIG. 2 and which has already been explained, at a measuring frequency of 7 MHz.

In addition it should be mentioned that an additional transistor ($T_8$) operated in base connected is arranged in a circuit having symmetrical output connections at two transistors of the differential amplifier input stage preferably in each collector current path of these transistors. Both operating resistors in the collector current branches of the differential amplifier transistors are connected to the common switching transistor lying in the bypass or discharge current circuit via a resistor in each case.

The circuit in accordance with the invention according to FIGS. 2–5 is implemented exclusively with bipolar npn transistors for example, whereby the diodes $D_1$–$D_4$ are preferably transistors connected as diodes. All of the components are housed in an integrated monolithic semiconductor circuit in which other function stages of a more complex circuit may be contained at the same time.

What is claimed is:

1. In an HF broadband amplifier switchable by an external control command between amplification and attenuation, comprising a differential amplifier input stage including two transistors and receiving an a.c. input signal, a voltage divider circuit for setting the potential at the differential amplifier and connected between the poles of the supply voltage, a bypass or discharge current circuit through which the d.c. current maintaining the d.c. voltage present at an operating resistor flows in the switched off condition of the differential amplifier, the improvement comprising an additional transistor having its collector-emmiter path connected in a collector current circuit of at least one said transistor of said differential amplifier for attenuating the a.c. signal present at said amplifier input stage in the switched off condition, and wherein said operating resistor lies in the collector current circuit in which said additional transistor is connected, said additional transistor is connected between said operating resistor and the collector of said at least one transistor of said differential amplifier, the base of said additional transistor is operated in base connection and switched to a reference potential of low resistance in HF terms to reduce the capacitative coupling between the input and output of said amplifier circuit, and said bypass or discharge circuit is connected to a connection point between said operating resistor and said additional transistor.

2. An HF broadband amplifier as defined in claim 1, and comprising a low resistance differential resistor of said voltage divider circuit for connecting the base of said additional transistor to said reference potential.

3. An HF broadband amplifier as defined in claim 2, wherein said low-resistance differential resistor comprises a series connection of rectifying components operated in a forward direction.

4. An HF broadband amplifier as defined in claim 1, wherein said additional transistor has its emitter electrode connected to the collector electrode of a transistor of said differential amplifier, and its collector electrode connected to said operating resistance which is in turn connected to the d.c. supply voltage source.

5. An HF broadband amplifier as defined in claim 1, and comprising a current source for said differential amplifier input stage arranged in the current circuit between the emitter electrodes of said transistors of said differential emplifier and said reference potential and circuit means for switching said current source and said bypass or discharge current circuit simultaneously to allow current to flow only in one of said current circuits.

6. An HF broadband amplifier as defined in claim 5, and comprising a switching transistor for connecting said current source to said reference potential, and a further preswitched transistor in said bypass or discharge current circuit for switching over said switches transistor with the aid of an externally supplied control command.

7. An HF broadband amplifier as defined in claim 6, and comprising a further transistor connected after said preswitched transistor and having a collector connected to the d.c. voltage source via a series resistor and with said further transistor controlling said switching transistor.

8. An HF broadband amplifier as defined in claim 1, and comprising a current source including a current source transistor is connected to the emitter electrode of a forsaid differential amplifier a collector an emitter for said current source transistor connected to a resistor, for said current source transistor connected to the emitter electrodes of said transistors of said differential amplifier and a base for said current source transistor connected to a potential tapping on said voltage divider circuit.

9. An HF broadband amplifier as defined in claim 8, and comprising a first switching transistor switched to reference potential, controlled by said control command and connected to said base of said current source transistor for switching said current source on or off and a second switching transistor lying in the bypass or discharge current circuit and controlled by said control command to be conductive or blocked with said first switching transistor.

10. An HF broadband amplifier as defined in claim 1, and comprises a current setting element or a constant current source is arranged in the bypass or discharge current circuit.

11. An HF broadband amplifier as defined in claim 1, wherein said operating resistor comprises a voltage divider to a tapping of which said bypass or discharge current circuit is connected.

12. An HF broadband amplifier as defined in claim 1, and comprising an RC element, determining the lower limit frequency of the broadband amplifier, connected to the output of the amplifier circuit for enabling switchover to take place between amplification and attenuation or vice versa in a substantially shorter time than is the case using the reciprocal value of the lower limit frequency $1/f_u$, caused by the constant maintaining of the d.c. voltage present at the operating resistor.

13. An HF broadband amplifier as defined in claim 1, wherein said transistors are of the same type of conduction.

14. An HF broadband amplifier as defined in claim 13, wherein the transistors are of the npn type.

15. An HF broadband amplifier comprising a transistorised differential amplifier input stage, a voltage divide circuit for setting the potential at said differential amplifier input stage, an additional transistor for attenuating a.c. signals present at the input of said amplifier in its turned off condition, an emitter collector path for said additional transistor and connected into a collector current circuit of a transistor of said differential amplifier and a base for said additional transistor operated in base connection and switched to a reference potential of low resistance in HF terms to reduce capacitative coupling between input and output of said amplifier circuit.

* * * * *